(12) United States Patent
Santo (10) Patent No.: US 10,553,391 B2
(45) Date of Patent: Feb. 4, 2020

(54) SEM IMAGE ACQUISITION DEVICE AND SEM IMAGE ACQUISITION METHOD

(71) Applicant: HOLON CO., LTD., Saitama (JP)

(72) Inventor: Izumi Santo, Saitama (JP)

(73) Assignee: HOLON CO., LTD., Saitama (JP)

( * ) Notice: Subject to any disclaimer, the term of this patent is extended or adjusted under 35 U.S.C. 154(b) by 0 days.

(21) Appl. No.: 15/764,297

(22) PCT Filed: Sep. 9, 2016

(86) PCT No.: PCT/JP2016/076631
§ 371 (c)(1),
(2) Date: Mar. 28, 2018

(87) PCT Pub. No.: WO2017/056924
PCT Pub. Date: Apr. 6, 2017

(65) Prior Publication Data
US 2018/0286626 A1  Oct. 4, 2018

(30) Foreign Application Priority Data

Sep. 29, 2015 (JP) .................................. 2015-191857

(51) Int. Cl.
*H01J 37/28* (2006.01)
*H01J 37/147* (2006.01)
(Continued)

(52) U.S. Cl.
CPC .......... *H01J 37/147* (2013.01); *H01J 37/222* (2013.01); *H01J 37/244* (2013.01); *H01J 37/28* (2013.01);
(Continued)

(58) Field of Classification Search
CPC .. H01J 37/28; H01J 37/265; H01J 2237/1505; H01J 2237/221;
(Continued)

(56) References Cited

U.S. PATENT DOCUMENTS 4,766,311 A * 8/1988 Seiler ..................... G01B 15/00
 250/252.1
4,845,362 A * 7/1989 Sicignano ............... H01J 37/28
 250/310
(Continued)

FOREIGN PATENT DOCUMENTS

JP 2004-163420 A 6/2004
JP 2004-271269 A 9/2004
JP 2009-243993 A 10/2009

OTHER PUBLICATIONS

International Search Report issued in Application No. PCT/JP2016/076631, dated Nov. 15, 2016.

*Primary Examiner* — David A Vanore
(74) *Attorney, Agent, or Firm* — Michael Best & Friedrich LLP (57) ABSTRACT

An SEM image acquisition device including a scanning signal generation unit configured to rotate a scanning direction of the electron beam to be scanned on the sample and generate a scanning signal to be emitted on a position on the sample corresponding to a same region and same pixels on the sample; a deflection device configured to emit the electron beam on a position on the sample corresponding to the same region and the same pixels on the sample, on the basis of the scanning signal generated by the scanning signal generation unit; a detection and amplification unit configured to detect and amplify a signal from the position on the sample corresponding to the same region and the same pixels on the sample, on which the electron beam was emitted by being deflected by the deflection device; and an image generation unit configured to generate an image from when the position on the sample corresponding to the same region and the same pixels on the sample is irradiated, on the basis of the signal detected and amplified by the detection and amplification unit.

2 Claims, 8 Drawing Sheets

(51) Int. Cl.
   *H01J 37/22* (2006.01)
   *H01J 37/244* (2006.01)
(52) U.S. Cl.
   CPC . *H01J 2237/1505* (2013.01); *H01J 2237/226* (2013.01)
(58) Field of Classification Search
   CPC .. H01J 2237/20214; H01J 2237/30483; G01N 21/956; G01N 2223/611
   USPC .................................. 250/310, 311, 397, 307
   See application file for complete search history.

(56) References Cited

U.S. PATENT DOCUMENTS

| | | | | |
|---|---|---|---|---|
| 5,578,821 | A * | 11/1996 | Meisberger | H01J 37/28 250/310 |
| 6,172,363 | B1 * | 1/2001 | Shinada | G01R 31/305 250/307 |
| 6,194,718 | B1 * | 2/2001 | Dotan | H01J 37/222 250/307 |
| 6,426,501 | B1 * | 7/2002 | Nakagawa | H01J 37/28 250/252.1 |
| 6,727,911 | B1 * | 4/2004 | Yamada | H01J 37/265 250/310 |
| 7,519,942 | B2 * | 4/2009 | Ataka | G03F 7/70625 716/51 |
| 2002/0161534 | A1 * | 10/2002 | Adler | G01N 21/956 702/35 |
| 2004/0081350 | A1 | 4/2004 | Kitamura et al. | |
| 2005/0146714 | A1 * | 7/2005 | Kitamura | G06K 9/00 356/237.2 |
| 2005/0263715 | A1 * | 12/2005 | Nakasuji | H01J 37/141 250/396 M L |
| 2006/0043312 | A1 * | 3/2006 | Siebert | H01J 37/3023 250/398 |
| 2006/0245636 | A1 * | 11/2006 | Kitamura | G06K 9/00 382/149 |
| 2008/0054187 | A1 * | 3/2008 | Yamamoto | H01J 37/222 250/396 R |
| 2008/0067380 | A1 * | 3/2008 | Ozawa | G06T 5/006 250/310 |
| 2009/0242760 | A1 | 10/2009 | Miyamoto et al. | |
| 2018/0286626 | A1 * | 10/2018 | Santo | H01J 37/222 |

* cited by examiner

| ROTATION ANGLE | IMAGE DATA | IMAGING CONDITIONS | CORRECTION COEFFICIENTS | OTHER |
|---|---|---|---|---|
| | | ACCELERATION VOLTAGE V1 CURRENT I1 MAGNIFICATION M1 SAMPLE NAME S1 | HEIGHT CORRECTION MAGNIFICATION DIFFERENCE | |
| 45° | 1 | * | * * | |
| -45° | 2 | * * * | | |
| 0° | 3 | | | |
| 90° | 4 | | | |

13

※ (1 PIXEL OF 8-BIT DATA) m TIMES
※ 60 TIMES/4 = 15 TIMES INTEGRATION OR DATA SET

SYNTHSIZED IMAGE OF 45°, -45°, 0°, AND 90° SCAN IMAGES

FIG. 8B

SYNTHSIZED IMAGE OF 45° AND -45° SCAN IMAGES

FIG. 8A

SYNTHSIZED IMAGE OF 0° SCAN IMAGES

SEM IMAGE ACQUISITION DEVICE AND SEM IMAGE ACQUISITION METHOD

BACKGROUND OF THE INVENTION

Technical Field

The present invention relates to an SEM image acquisition device and an SEM image acquisition method whereby an image is acquired by emitting an electron beam on a sample and detecting electrons emitted or reflected from or absorbed by the sample.

Description of the Related Art

Semiconductor devices have been increasingly miniaturized and the pattern sizes of LSI exposure masks have become smaller. Also, optical proximity correction (OPC) is used. These developments have resulted in the shapes of mask patterns becoming extremely complicated.

As such, single dimension inspection in a specific direction such as pattern line width measurement or hole diameter measurement for masks has become insufficient, and contour extraction is needed to perform inspection in two directions such as area measurement, and also carry out exposure simulations.

SUMMARY OF THE INVENTION

Problems to be Solved by the Invention

When performing measurements in two dimensions, pattern edges (hereinafter referred to as "edges") exist that have various angular directions such as circular patterns and inclined patterns with rounded rectangular corners. When such edges are parallel to a scanning direction of a narrowly focused electron beam, problems occur such as signals becoming reduced and black lines (tailing) appearing due to the influence of charging at the edges of the pattern and the like.

To solve these problems, image acquisition methods in which an electron beam is scanned on a mask from a direction rotated to a predetermined angle have been conceived. For example, technology has been proposed in which a rotated image is acquired by rotating a sample and scanning the sample with an electron beam. In addition, technology has been proposed in which a rotated image is acquired by simply rotating the scanning direction of the electron beam.

In these methods, synthesis or the like can only be performed after cutting the image before rotation out of the image after rotation and matching the fields thereof to match the image before rotation with the scanning range thereof from the acquired rotated image. Otherwise, the fields will differ and synthesis will not be possible.

Additionally, the range that the electron beam is scanned on the mask before rotation and the range that the electron beam is scanned on the mask after rotation differs exactly the amount of rotation and it is impossible to cause the emission conditions on the mask to strictly match. Consequently the emission conditions (emission ranges) vary.

Furthermore, when acquiring images from different scanning directions (scanning directions of the electron beam), even if the ranges (regions) scanned by the electron beam are cut out and the made the same, there are fundamental problems such as the position on the mask of the pixels of each image will differ, matching the position on the mask is impossible or extremely difficult, and acquiring each of the pixel signals from the same position on the mask is impossible.

Means of Solving the Problems

According to the present invention, when acquiring images from different scanning directions (scanning directions of the electron beam), it is possible to acquire and synthesize images of pixel signals from the same position on a mask by scanning an electron beam at pixel correspondence to acquire and synthesize the images.

An aspect of the present invention is an SEM image acquisition device configured to acquire an image by emitting an electron beam on a sample and detecting electrons emitted or reflected from or absorbed by the sample. The SEM image acquisition device includes a scanning signal generation unit configured to rotate a scanning direction of the electron beam to be scanned on the sample and generate a scanning signal to be emitted on a position on the sample corresponding to a same region and same pixels on the sample; a deflection device configured to emit the electron beam on a position on the sample corresponding to the same region and the same pixels on the sample, on the basis of the scanning signal generated by the scanning signal generation unit; a detection and amplification unit configured to detect and amplify a signal from the position on the sample corresponding to the same region and the same pixels on the sample, on which the electron beam was emitted by being deflected by the deflection device; and an image generation unit configured to generate an image from when the position on the sample corresponding to the same region and the same pixels on the sample is irradiated, on the basis of the signal detected and amplified by the detection and amplification unit.

In the aspect of the present invention, the SEM image acquisition device may further include a synthesis unit configured to synthesize a plurality of images of the position corresponding to the same region and the same pixels on the sample from when the sample is scanned from different rotation directions by the electron beam, on the basis of the signal detected and amplified by the detection and amplification unit.

In the aspect of the present invention, the synthesis unit may be configured to synthesize each of a plurality of images of a same rotation direction and a plurality of images of a plurality of differing rotation directions.

In the aspect of the present invention, the synthesis unit may be configured to synthesize a plurality of acquired images by signal (pixel signal) of the position corresponding to the same region and the same pixels on the sample.

In the aspect of the present invention, the synthesis by signal (pixel signal) may be integration or averaging by signal (pixel signal).

In the aspect of the present invention, the scanning signal generation unit may be configured to make clock cycles the same, or increase the clock cycles, or decrease the clock cycles; generate, as the scanning signal, a signal sequentially scanned in a predetermined rotation direction on positions corresponding to all pixels within the same region on the sample; and make total scanning time the same, or increase the total scanning time, or decrease the total scanning time.

In the aspect of the present invention, the scanning signal generation unit may generate, as the scanning signal, one or more of scanning signals for which a direction to which scanning direction of the electron beam is rotated to is at least one selected from the group consisting of 0°, (tan$^{-1}$½°), 45°, (tan$^{-1}$ 2°), 90°, and a direction obtained by adding or subtracting an integer multiple of 90° thereto, the direction being within a range of 0° to 360° or a range of −180° to 180°.

Advantageous Effects of the Invention

With the SEM image acquisition device and the SEM image acquisition method according to the present invention, when acquiring images from different scanning directions (scanning directions of the electron beam), images of pixel signals from positions of the same pixels on a sample are acquired and synthesized. As a result, situations in which the signals become reduced or black lines (tailings) appear due to the influence of charging or the shape of the edges of circular patterns when performing measuring in two dimensions or the like is eliminated and measuring accuracy is improved.

As such, edges can be extracted with high accuracy from patterns in the synthesized image, having edges in any direction including circular patterns, inclined rectangular patterns, and the like. As a result, width measurements, area measurements, contour extraction, and other processes can be carried out on the patterns with high accuracy.

Additionally, conventionally, 60 images acquired in the same scanning direction were synthesized to obtain a synthesized image (with improved the S/N ratio) but, with the SEM image acquisition device and the SEM image acquisition method according to the present invention, 30 images are acquired by dividing into two directions, that is, each of the 45° and −45° scanning directions or 15 images are acquired by dividing into four directions, that is, each of the 0°, −45°, 45°, and 90° scanning directions, and then all of the acquired images are synthesized to generate a synthesized image. This configuration enables the highly accurate extraction of edges in any direction from a two-dimensional pattern; and the highly accurate performance of width measurement, area measurement, contour extraction, and other processes on edges in any direction of a two-dimensional pattern in the same amount of time as in the conventional technology (that is, in this case a total of 60 images are synthesized, so the time is the same).

Furthermore, with the SEM image acquisition device and the SEM image acquisition method according to the present invention, the clocks of the scanning signals are the same. As such, the times to acquire one rotation image can all be set to the same time, and the ranges on the sample where the electron beam is emitted can be set to the same range and the same pixels. Note that, as necessary, the interval of the clocks of the scanning signals can be increased or decreased to easily change, that is, increase or decrease, the total image scanning time.

DETAILED DESCRIPTION OF THE INVENTION

First Embodiment

Figure 1:
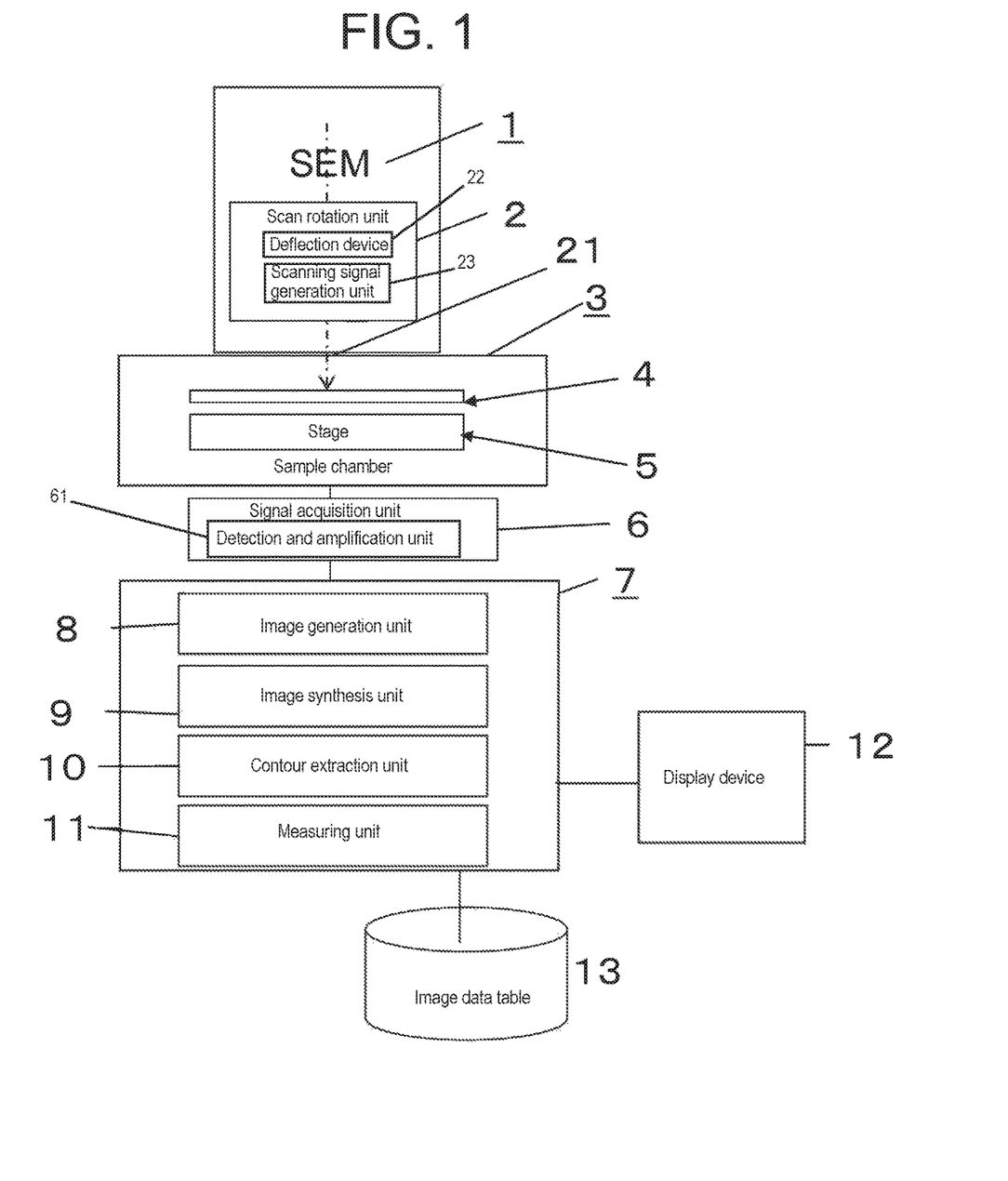
FIG. 1 is a configuration diagram according to an embodiment of the present invention.

FIG. 1 illustrates a configuration diagram according to a first embodiment.

An SEM 1 illustrated in FIG. 1 is a scanning electron microscope and includes an electron gun that generates an electron beam accelerated at a predetermined acceleration voltage, a blanking electrode that deflects the electron beam generated by the electron gun so as to block or allow the electron beam to pass, a condenser lens that converges the electron beam, and an objective lens that narrowly focuses the converged electron beam and emits the electron beam on a sample 4.

A scan rotation unit 2 rotates an emission direction of the electron beam 21 on the sample 4. The scan rotation unit 2 includes a deflection device 22 and a scanning signal generation unit 23.

The deflection device 22 scans (plane scanning in the X-direction and the Y-direction) the electron beam 21, which is narrowly focused by the objective lens, on the surface of the sample 4. The deflection device 22 includes an electrostatic deflection electrode or an electromagnetic deflector.

The scanning signal generation unit 23 generates scanning signals that rotate the emission direction, with respect to the deflection device 22, of the electron beam 21 on the sample 4. Additionally, the scanning signal generation unit 23 generates signals that scan the same region and the same pixels on the sample from a predetermined rotation direction (described later using FIGS. 2 to 8).

A sample chamber 3 is a vacuum-evacuable container in which the sample 4 or the like is stored.

The sample 4 is an object on which the electron beam 21 is emitted and is, for example, a mask, a wafer, or the like to be measured of a pattern.

A stage 5 is a moving stand that is movable in the X-direction, the Y-direction, and the Z-direction. The sample (mask) 4 is mounted and secured on the stage 5. The position of the stage 5 is measured precisely in real time using a laser interferometer (not illustrated).

A signal acquisition unit 6 acquires signals by detecting and amplifying the secondary electrons and reflected electrons emitted from and also the electrons absorbed by the sample 4 with the detection and amplification unit 61 when the electron beam 21 is scanned on the surface of the sample 4. The signal acquisition unit 6 is, for example, a microchannel plate (MCP).

A computer 7 is a personal computer that executes various controls and processes in accordance with programs. In the present embodiment, the computer 7 includes an image generation unit 8, an image synthesis unit 9, a contour extraction unit 10, a measuring unit 11, a display device 12, and an image data table 13.

The image generation unit 8 sequentially associates signals (one-dimensional signals), acquired by the signal acquisition unit 6, from positions corresponding to the same region and the same pixels on the sample 4 from when the electron beam 21 was scanned on the sample 4 at the predetermined rotation direction, with signals of pixels of the image in the scanning direction (two-dimensional signals), and generates (restores) images (described later with reference to FIG. 3).

The image synthesis unit 9 synthesizes the plurality of images, which were scanned in the predetermined rotation direction, generated (restored) by the image generation unit 8. Specifically, the image synthesis unit 9 synthesizes, by integrating or averaging by pixels, a plurality of images of the same rotation direction and a plurality of images of differing rotation directions (described later with reference to FIGS. 2 to 8).

The contour extraction unit 10 is a typical unit for extracting the contours (edges) of a pattern from the images synthesized by the image synthesis unit 9 (e.g. see hereinafter described FIGS. 8B and 8C).

The measuring unit (measurement unit) 11 is a typical unit for measuring the width, area, and the like of a pattern.

The display device 12 displays images and the like and, in this case, is a display.

Figure 5:
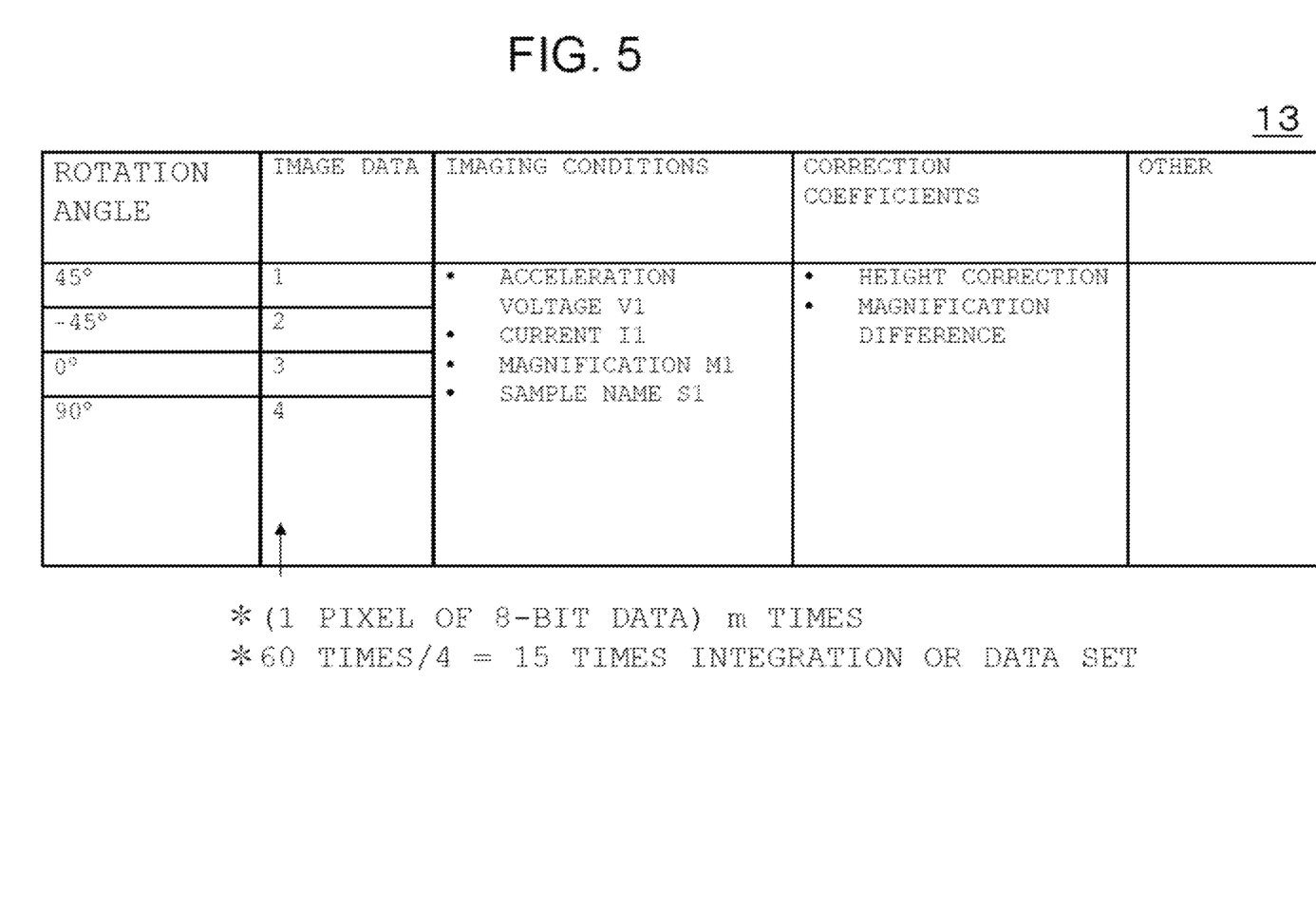
FIG. 5 is an example of an image data table according to an embodiment of the present invention.

The image data table 13 is a table in which the image information, images, and the like of the present embodiment are stored (see FIG. 5).

Next, operations of the constituents illustrated in FIG. 1 will be described in detail with reference to the flowchart of FIG. 2.

Figure 2:
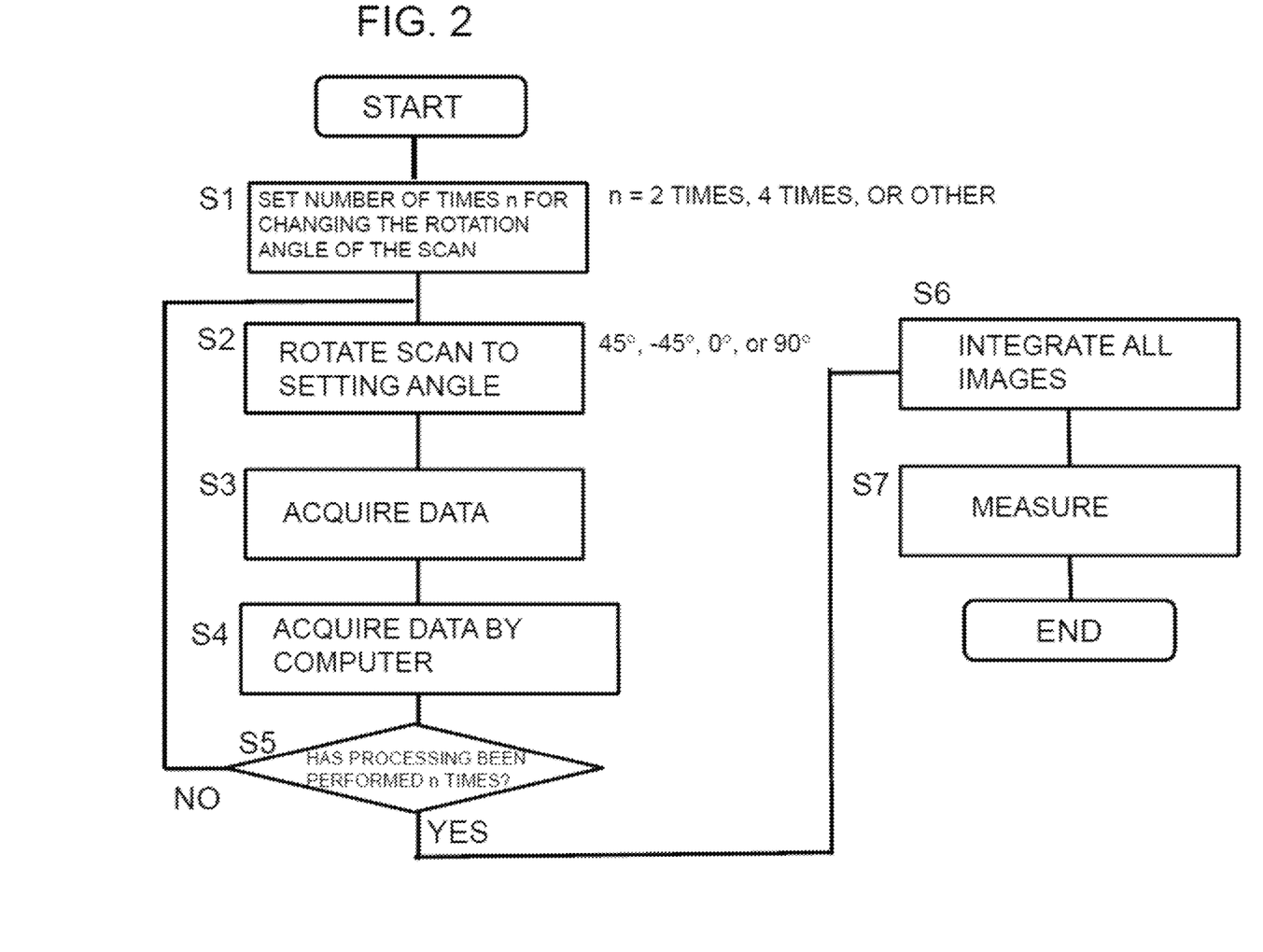
FIG. 2 is an image acquisition flowchart according to an embodiment of the present invention.

FIG. 2 illustrates an image acquisition flowchart according to the present embodiment.

In step S1, the number of times n for changing the rotation angle of the scan is set. As indicated on the right side in FIG. 2, n is set to 2 times, 4 times, or other. In the present embodiment, n is set to 4 times. More specifically, in step S1, the number of times n for changing the direction (rotation angle) that the electron beam 21 is scanned on the sample 4 is set. For example, in the case of FIG. 8B (described later), n is set to 2 times (the rotation angle is changed to 45° and −45°, therefore n=2 times), and in the case of FIG. 8C, n is set to 4 times (the rotation angle is changed to 45°, −45°, 0°, and 90°, therefore n=4 times).

In step S2, the scan is rotated to the setting angle. Specifically, since n was set to 4 times in step S1, the scan is sequentially set to one of 45°, −45°, 0°, or 90° for each repetition of the scan.

In step S3, data is acquired. In cases where, for example, the first setting angle set in step S2 is 45°, signals (scanning signals) to be sequentially scanned on the pixels are generated having the direction (upward and to the right in the direction of 45°) indicated by the dashed arrows of the (b) 45° scan in the upper left of FIG. 3 (described later) as the scanning direction. The scanning of the electron beam 21 of FIG. 1 on the sample 4 upward and to the right in the direction of 45° (indicated by the dashed arrows of the (b) 45° scan in FIG. 3) is repeated for all the pixels in the rectangular region on the sample 4 on the basis of the scanning signals. Secondary electrons (reflected electrons, absorbed electrons) emitted when scanning are detected and amplified and acquired by the signal acquisition unit 6 of FIG. 1.

In step S4, the computer acquires an image. Specifically, the signals having the 45° scanning direction acquired in step S3 for all of the pixels in the rectangular region on the sample 4 are sequentially positioned as signals of positions of the corresponding pixels of FIG. 3, and an image is generated (the original image is restored). That is, an image is generated (restored) by associating the one-dimensional signals with the signals of the pixels of the two-dimensional image.

In step S5, it is determined if processing has been performed n times. That is, it is determined if the processing for the n times set in step S1 (4 times in this case) has been completed. If "NO" is determined, step S2 is executed and subsequent processing is performed. On the other hand, if "YES" is determined, step S6 is executed since the processing for all n times (here, n=4 times) has been completed.

In step S6, all of the images are integrated. Specifically, for example, when n is set to 4 times in step S1, step S2 to step S4 are repeated 4 times and images scanned from the 45°, −45°, 0°, and 90° directions are acquired. Accordingly, in step S6 the images of the four sets are integrated (or averaged) by pixel correspondence to generate a single synthesized image. Note that, a total of 60 images were synthesized in the experiment. Of these:

15 images were acquired at 45°
15 images were acquired at −45°
15 images were acquired at 0° and
15 images were acquired at 90.°

These 60 images were integrated by pixel correspondence in step S6 to generate the image shown in FIG. 8C (described later). Note that when the number of gradations is excessive in the integration processing by pixel correspondence, a desired number of upper bits after the integration may be extracted and used. In such a case, lower bits are discarded.

In step S7, measurement is performed. Specifically, measurement (e.g. measurement of the width size, area, or the like of the rectangle) is performed using the synthesized image obtained by integrating all of the pixels in step S6.

As described above, the number of times n for changing the rotation angle of the scan can be set as desired and, as a result, it is possible sequentially change the scan rotation angle and scan to acquire images, and acquire synthesized images from a plurality of scanning directions by synthesizing these images.

As a result:
in, for example, cases where the scanning direction is a single direction as illustrated in the image of FIG. 8A (described later), the lines of the pattern parallel to the scanning direction appear to narrow and darken due to the influence of charging, the edge shape, and the like, but
in, for example, the image illustrated in FIG. 8C that was synthesized after scanning in the four directions of 45°, −45°, 0°, and 90° described above, in contrast to FIG. 8A, there is no fading of the lateral lines in the pattern and the edges are sharp from all directions. As a result, it is possible to measure the width, spacing, and the like of the edges from all directions and calculate the area of the pattern with high accuracy, perform contour extraction for exposure simulations, and the like.

Figure 3:
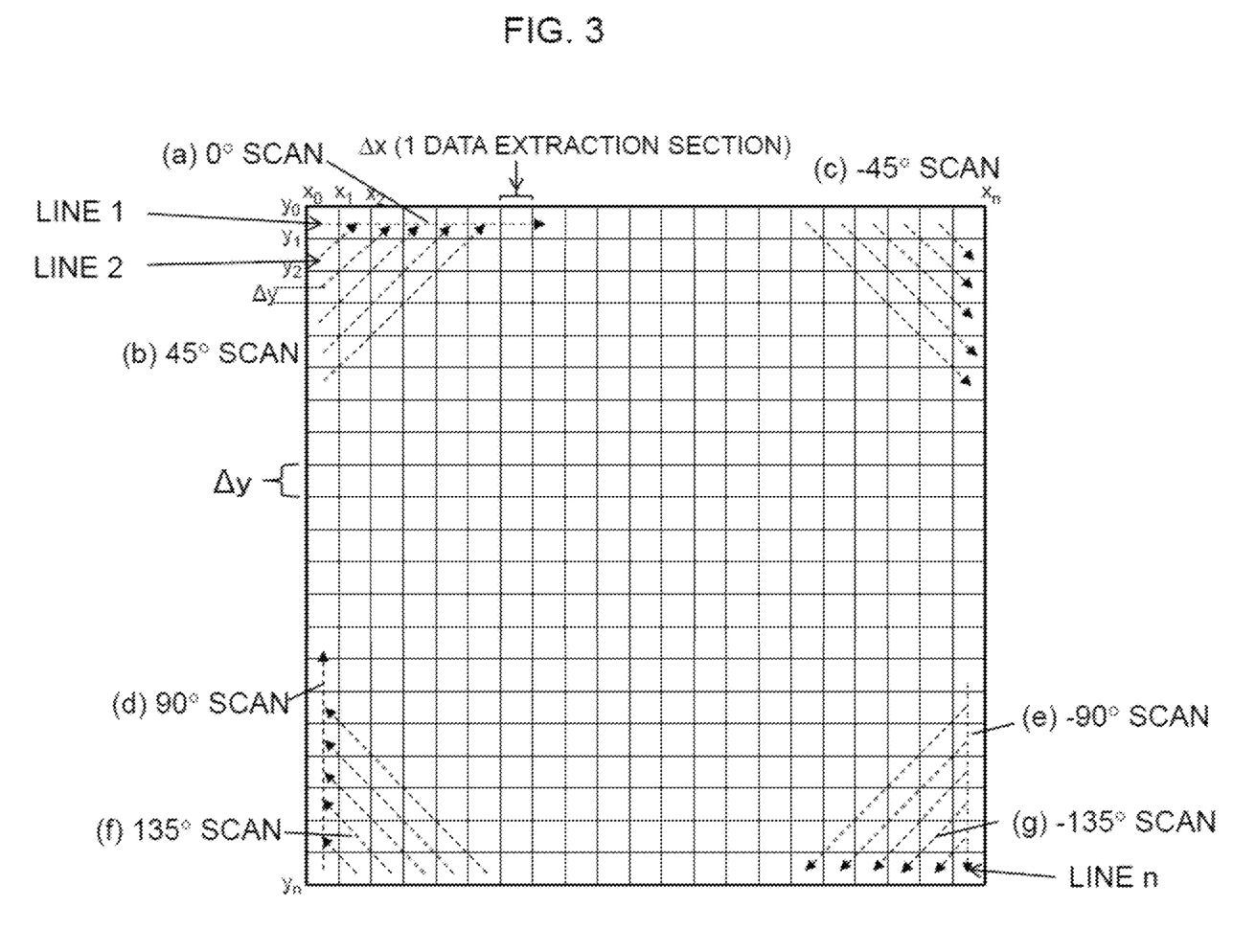
FIG. 3 is a diagram for explaining the electron beam scanning directions and data extraction pixels according to an embodiment of the present invention.

FIG. 3 is a diagram explaining the electron beam scanning directions and data extraction pixels of the present embodiment.

In FIG. 3, examples of the following are schematically illustrated:
 (a) is a 0° scan
 (b) is a 45° scan
 (c) is a −45° scan
 (d) is a 90° scan
 (e) is a −90° scan
 (f) is a 135° scan and
 (g) is a −135° scan.

Note that the electron beam scan region is the same region (same range) in the illustrated rectangle (square), each small square corresponds to a pixel, and the electron beam 21 sequentially scans (digitally scans) across the center position of each of the small squares.

As described above, the same region and the same pixels are defined for all of the scanning directions, and scanning signals are generated that sequentially scan each pixel in the illustrated scanning direction at the same clock. Moreover, the deflection device deflects the electron beam 21 such that the electron beam 21 is scanned on the sample 4 on the basis of the generated scanning signals. This configuration enables the sequential scanning of the pixels (positions) on the sample 4 in the scanning directions depicted in FIG. 3.

The scans of (a) to (g) in FIG. 3 are integer multiples of 0° and 45° scans, and are expressed as being within a range of −180° to 180° (or within a range of 0° to 360°). This concept is described in simple terms below.

(1) When one of x and y is a 0 pixel and the other is a 1 pixel direction rotation, the scanning directions are the following integer multiples of 0° and 45°: −180°, −135°, −90°, −45°, 0°, 45°, 90°, 135°, and 180° (0°, 45°, 90°, 135°, 180°, 225°, 270°, 315°, and 360°) and are within the range of −180° (0°) to 180° (360°).

(2) When one of x and y is a 1 pixel and the other is a 2 pixel direction rotation, the scanning directions are the following directions obtained by adding or subtracting integer multiples of 90° to or from about 26° (more accurately $\tan^{-1} 1/2$) and about 63° (more accurately $\tan^{-1} 2$): . . . −63°, −26°, 26°, 63°, and so on (26°, 63°, and so on) and are within a range of −180° to 180° (0° to 360°).

(3) Likewise, when one of x and y is a (n−1) pixel and the other is a n pixel direction rotation, the scanning directions are directions obtained by adding or subtracting integer multiples of 90° to or from $\tan^{-1}(n-1)/n$ and, $\tan^{-1} n/(n-1)$, and are angles within a range of)−180° (0° to) 180° (360° (specific values are omitted).

Figure 4:
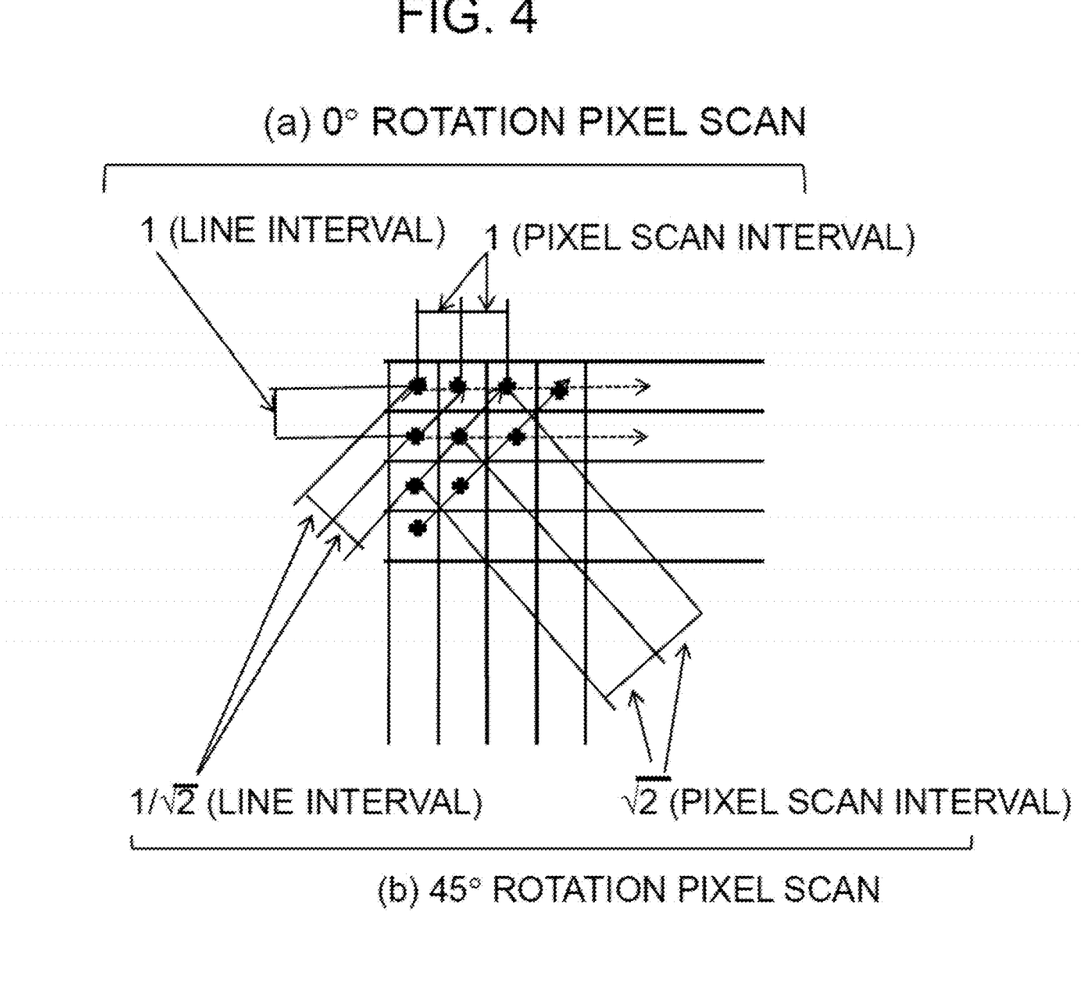
FIG. 4 is a diagram for explaining a 45° rotation pixel scan according to an embodiment of the present invention.

FIG. 4 is a diagram explaining a 45° rotation pixel scan of the present embodiment. Specifically, FIG. 4 schematically illustrates details of the 45° scan depicted in (b) of FIG. 3.

The (a) 0° rotation pixel scan in FIG. 4 corresponds to the (a) 0° scan in FIG. 3. In the (a) 0° rotation pixel scan, each pixel is sequentially scanned horizontally to the right, at a 1 pixel scan interval of 1 (horizontal and vertical intervals of each pixel are defined as 1), and a 1 line interval of 1.

Accordingly, 1 pixel scan interval×1 line interval=1.

The (b) 45° rotation pixel scan corresponds to the (b) 45° scan in FIG. 3. In the (b) 45° rotation pixel scan, each pixel is sequentially scanned upward to the right in the direction of 45°, at a 1 pixel scan interval of $\sqrt{2}$ (or approximately 1.4), and a 1 line interval of $1/\sqrt{2}$ (or approximately 0.7).

Accordingly, 1 pixel scan interval×1 line interval=$\sqrt{2}\times1/\sqrt{2}$=1, which is the same scanning time as the 0° rotation pixel scan. As a result, the total time to acquire 1 image is the same.

Implementing the settings described above, generating each scanning signals at the same clock interval, and setting (restoring) the each of the signals acquired by sequentially scanning the positions by pixel correspondence on the sample 4 to the signals of the positions of the original pixels enable the generation of the 0° rotation image and the 45° rotation image in the same amount of time. Moreover, a synthesized image can be generated by synthesizing (e.g. integrating; see step S6 of FIG. 2) both generated images by pixel correspondence.

When moving from the pixel of an end point to the pixel of a start point when scanning in the predetermined rotation direction, pulse voltage is applied to the blanking electrode to perform what is typically known as blanking. As a result, the electron beam is not emitted on a path from the position (pixel) of the end point to the position (pixel) of the start point of the sample 4 while the electron beam moves along this path.

FIG. 5 illustrates an example of an image data table of the present embodiment. Specifically, the information set in the flowchart of FIG. 2 and the following various preset information are stored in the image data table.

Rotation angle: The rotation angle determined by n, which is set in step S1 of FIG. 2;
Image data: Image data acquired at the rotation angle which, as described below the image data table of FIG. 3 includes:
  (1 pixel of 8-bit data) m times;
  60 times/4=15 times integration: A case where all of the images (60 images) are synthesized by integration when the total number of images is 60, wherein scans are performed in the four directions of 0°, −45°, 45°, and 90°, and 15 images are acquired for each direction.
Data groups: In the preceding example, an image group of 60 images.
Imaging conditions: Imaging conditions for capturing the images. Specifically, information such as acceleration voltage, current, magnification, and sample name.
Correction coefficients: Correction coefficients such as height correction and magnification differences.
Other:

As described above, the images acquired from the plurality of scanning directions or the synthesized image, and the rotation angle, imaging conditions, correction coefficients, and other information related thereto is recorded and stored in the image data table 13. As such, it is possible to easily perform measurements (e.g. measurements of dimensions and area) of patterns in a sample image by referencing the image data table 13.

Figure 6:
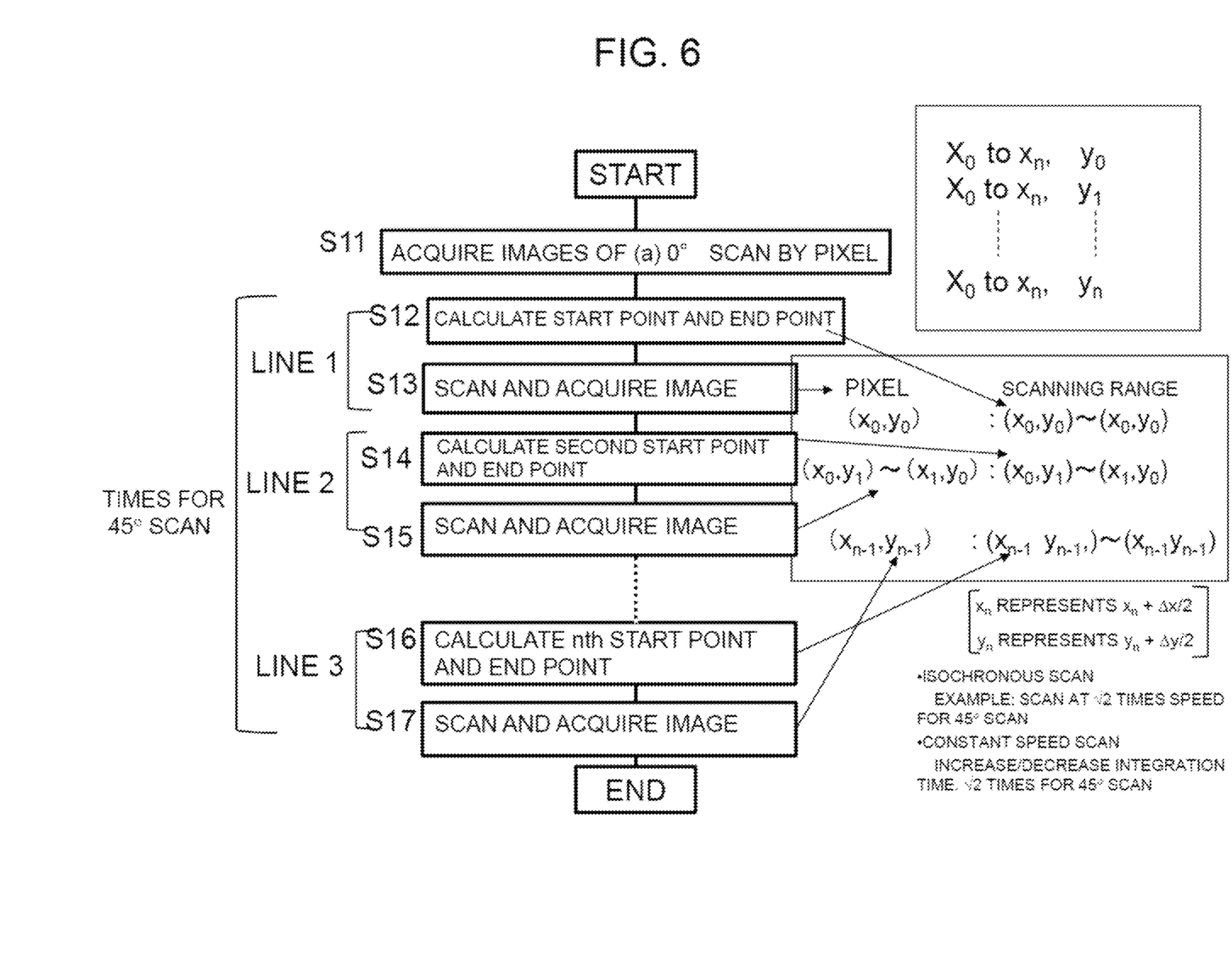
FIG. 6 is a rotation pixel scan flowchart according to an embodiment of the present invention.

FIG. 6 illustrates a rotation pixel scan flowchart of the present embodiment. Specifically, FIG. 6 is a flowchart explaining the details of scanning the same region and the same pixels in the predetermined scanning direction described above.

In FIG. 6, in step S11, a 0° direction image is acquired for each pixel. Specifically, in FIG. 3 described above, one image (one frame) of the (a) 0° scan is acquired by sequentially scanning from top to bottom in the direction of the (a) 0° scan (from the left edge to the right edge), detecting and amplifying to acquire the signals of each of the pixels at that time, and setting those signals in the memory as signals (brightness signals, normally 8-bit) of each illustrated corresponding position (pixel). Typically, there is a total of 60 images and, in this case, images of two scanning directions are acquired, namely the (a) 0° scan and the (b) 45° scan. Therefore, the total 60 images is divided by two and 30 images of the (a) 0° scan are acquired.

Next, one image of the (b) 45° scan is acquired by executing steps S12 to S17.

In step S12, the start point and the end point are calculated. Specifically, the start point and the end point of the scanning range are set as follows for the first line 1:
  Start point (x0,y0) of scanning range
  End point (x0,y0) of scanning range.

Note that, in this case, for the sake of ease of understanding, coordinates of the centers of the pixels represented by the small squares in FIG. 3, namely (xn+Δx/2, yn+Δy/2, where n=0 to n), are represented as (xn,yn). Additionally, Δx and Δy are respectively the X-direction and Y-direction sizes (widths) of the pixels represented as small squares.

In the example of step S12, the start point and the end point are the same, so one point is scanned.

In step S13, images are acquired by scanning. Specifically, the range from the start point to the end point set in step S12 is scanned pixel by pixel and signals (typically detected and amplified 8-bit brightness signals) from each of the pixels are acquired.

In steps S12 and S13, the signal of the pixel determined by the start point and the end point of line 1 of the (b) 45° scan (one pixel in this case) is acquired.

Likewise, in steps S14 and S15, the signals of the pixels determined by the start point and the end point of line 2 of the (b) 45° scan (two pixels in this case) are acquired.

Likewise, the signals of the pixels determined by the start point and the end point of line (n−1) from line 3 of the (b) 45° scan (three pixels and so on in this case) are acquired.

Likewise, in steps S16 and S17, the signal of the pixel determined by the start point and the end point of line n of the (b) 45° scan (the last pixel in this case) is acquired.

By executing the steps S12 to S17, the pixels of line 1 to line n of the (b) 45° scan are each acquired and one image is generated. This processing is repeated to acquire 30 images of the (b) 45° scan.

Thus, 30 images of the (a) 0° scan are acquired in step S11 and 30 images of the (b) 45° scan are acquired in steps S12 to S17. By integrating (or averaging) the pixels of all of these images, one synthesized image can be generated.

Note that in the present embodiment, the scanning speed is set as follows, but is not limited thereto. Typically, isochronous scanning (scanning using the same time interval clock) is used so that the time to acquire one image is the same regardless of the rotation direction of the scanning.

Isochronous scanning (scanning using the same time interval clock): For example, in the case of the (b) 45° scan described in steps S12 to S17, scanning is performed at a speed of √2 times and the scan line interval to be scanned is 1/√2 times. Therefore, the scanning time of all of the pixels is the same.

Constant speed scanning (scanning at the same scanning speed): Increases or decreases the integration time. For example, in the case of the (b) 45° scan described in steps S12 to S17, the integration time increases √2 times (the clock interval increases √2 times).

Figure 7:
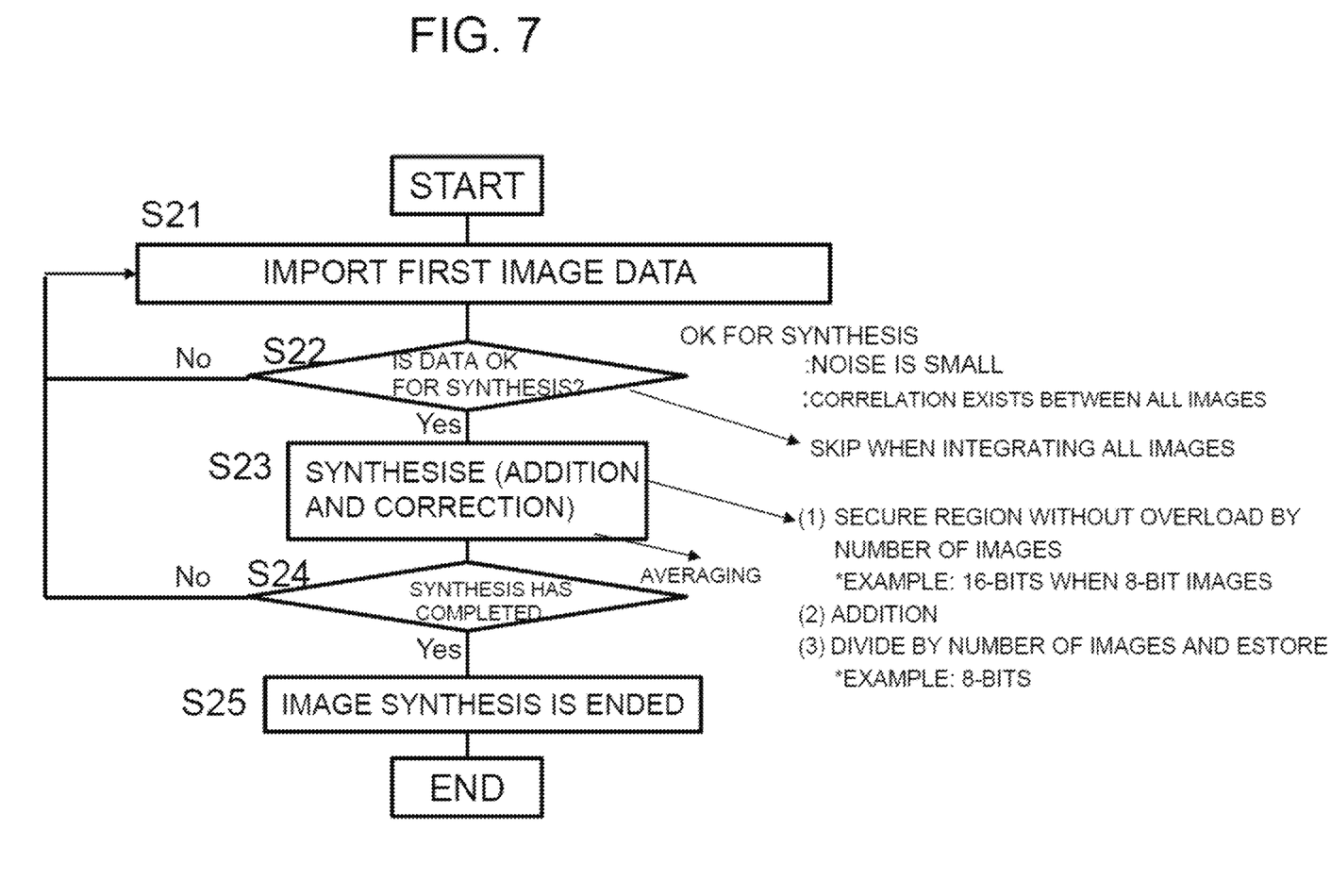
FIG. 7 is an image synthesis flowchart according to an embodiment of the present invention.

FIG. 7 illustrates an image synthesis flowchart of the present embodiment.

In FIG. 7, in step S21, the first (and second and so on) image data is imported.

In step S22, it is determined if the image data is OK for synthesis. Specifically, it is determined if noise in the images captured in step S21 is below a threshold, and if there is correlation between the images (other images, all other images). If YES is determined, step S23 is executed. If NO is determined, synthesis is determined not to be made and canceled and step S21 is executed and the next image data is imported.

In step S23, synthesis (addition and correction) is performed. Specifically, the images imported in step S21 and determined as YES in step S22 are synthesized, that is, the brightness of each image is integrated or averaged by pixel. For example, in the case of synthesizing the 60 images described above, when one image is an 8-bit representation, a region is secured in which there is no overflow when integrating 60 8-bit images (at least a 14-bit and typically a 2-byte region), and integration is performed. Note that when averaging, the necessary number of bits (e.g. 8 bits) are extracted from the upper predetermined bits so as to prevent increases in processing time.

In step S24, it is determined if the synthesis has completed. Specifically, it is determined if the synthesis of step S23 has been completed for all of the images to be synthesized (e.g. in the example given above, all of the 60 images). If YES is determined, the image synthesis is ended at step S25. Thus, one synthesized image is generated (see FIGS. 8B and 8C).

The process described above enables the generation of one synthesized image, which is obtained by sequentially integrating, by pixel, all of the images scanned in the plurality of directions.

Figure 8A:
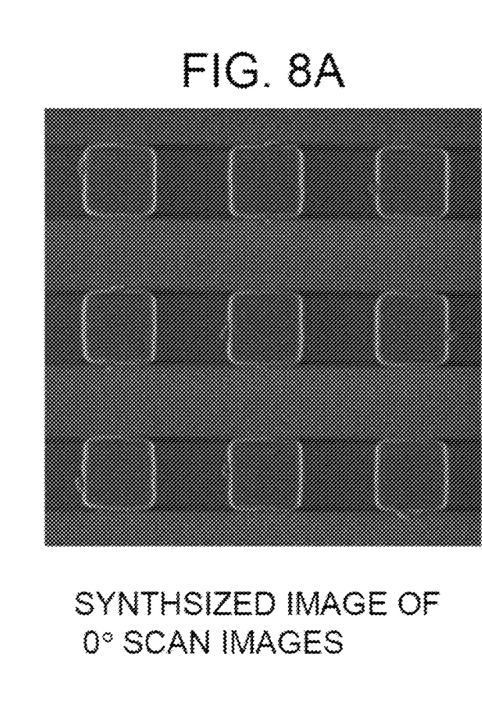
FIG. 8A is an example of a synthesized image according to an embodiment of the present invention.
Figure 8B:
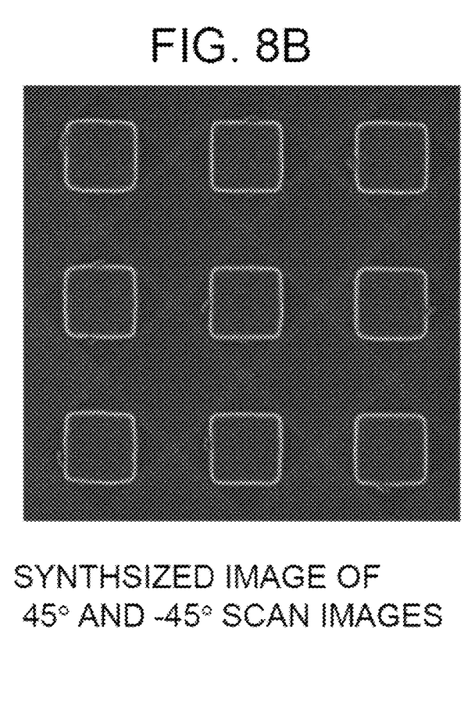
FIG. 8B is an example of a synthesized image according to an embodiment of the present invention.
Figure 8C:
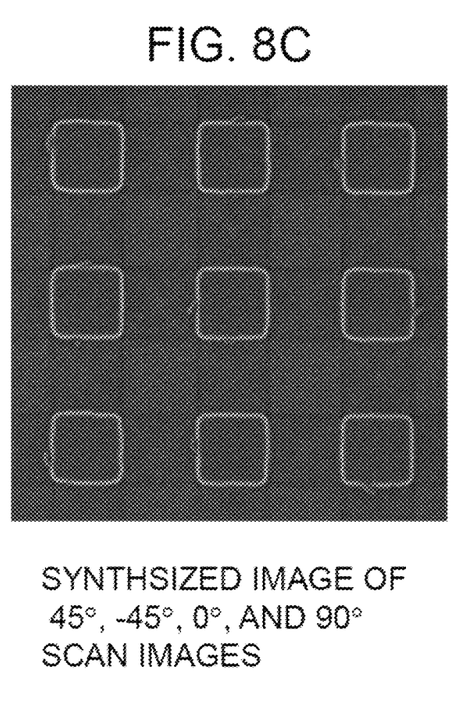
FIG. 8C is an example of a synthesized image according to an embodiment of the present invention.

FIGS. 8A to 8C illustrate examples of acquired images of the present embodiment.

FIG. 8A illustrates an example of a synthesized image of scans in one direction, namely the 0° scan; FIG. 8B illustrates an example of a synthesized image of scans in two directions, namely the 45° scan and the −45° scan; and FIG. 8C illustrates an example of a synthesized image of scans in four directions, namely the 45° scan, the −45° scan, the −0° scan, and the 90° scan. All of the synthesized images were synthesized from 60 images. FIG. 8A was synthesized from 60 0° scan images; FIG. 8B was synthesized from 30 45° scan images and 30 −45° scan images, for a total of 60 images; and FIG. 8C was synthesized from 15 45° scan images, 15 −45° scan images, 15 0° scan images, and 15 90° scan images, for a total of 60 images.

The synthesized image of the 0° scans illustrated in FIG. 8A was synthesized from scans in one direction. As such, in the sample, the lines on the top and bottom edges of the rectangular patterns substantially parallel to the direction of the 0° scanning were affected by charging, the shape of the line ends, and the like, which caused the lines to fade and dark lines (tailing) to appear. This resulted in the synthesized image being unclear.

On the other hand, the synthesized image of the 45° scans and the −45° scans illustrated in FIG. 8B was synthesized from scans in two directions. Specifically, FIG. 8B was synthesized from 30 images acquired from 45° scans from the lower left to the upper right and 30 images acquired from −45° scans from the upper left to the lower right. As such, the lines of the top and bottom edges of the rectangular patterns in FIG. 8B appeared clearer than in FIG. 8A, in which the top and bottom edges of the rectangular patterns were unclear.

Furthermore, the synthesized image of the 45° scans, the −45° scans, the 0° scans, and the 90° scans illustrated in FIG. 8C was synthesized from scans in four directions. Specifically, a synthesized image (integrated image) identical to that illustrated by FIG. 8B was obtained from the scans in two directions, namely the 45° scans from the lower left to the upper right and the −45° scans from the upper left to the lower right, and the scans in two more directions, namely the 0° scans from left to right and the 90° scans from bottom to top were added to generate a synthesized image.

As a result, the lines of the top and bottom edges of the rectangular patterns in FIG. 8C appeared clearer than in FIG. 8A, in which the top and bottom edges of the rectangular patterns were unclear and, while not illustrated in FIG. 8C, when viewing the rectangular patterns in FIG. 8C at a 45° incline, the lack of clarity in the top and bottom edges of the rectangular patterns disappeared, resulting in an extremely clear image.

Thus, the inventors discovered that in cases where the edges of the rectangular patterns on the screen are horizontal and perpendicular, clear images can be obtained from scans in two directions and scans in four directions as respectively illustrated in FIGS. 8B and 8C; and in cases where the edges of the rectangular patterns on the screen are horizontal and perpendicular, and also rectangular patterns inclined at 45° are present (or circular, elliptical or other patterns are present), clear images can be obtained from the scans in four directions as illustrated in FIG. 8C.

REFERENCE SIGNS

1 SEM (Scanning Electron Microscope)
2 Scan rotation unit
21 Electron beam
3 Sample chamber
4 Sample
5 Stage
5 Signal acquisition unit
7 Computer (PC)
8 Image generation unit
9 Image synthesis unit
10 Contour extraction unit
11 Measuring unit
12 Display device
13 Image data table

What is claimed is:

1. An SEM image acquisition method for acquiring an image by emitting an electron beam on a sample and detecting electrons emitted or reflected from or absorbed by the sample; the SEM image acquisition method comprising:
   rotating a scanning direction of the electron beam to be scanned on the sample;
   generating a scanning signal to be emitted on a position on the sample corresponding to a same region and same pixels on the sample as the electron beam;
   emitting the electron beam on a position on the sample corresponding to the same region and the same pixels on the sample, in response to the scanning signal;
   detecting and amplifying a signal from the position on the sample corresponding to the same region and the same pixels on the sample, on which the electron beam being emitted and deflected; and
   generating an image from when the position on the sample corresponding to the same region and the same pixels on the sample is irradiated, on the basis of the signal being detected and amplified;
   wherein the generating the scanning signal comprises:
      making clock cycles the same, or increasing the clock cycles, or decreasing the clock cycles;
      generating, as the scanning signal, a signal sequentially scanned in a predetermined rotation direction on positions corresponding to all pixels within the same region on the sample; and
      making total scanning time the same, or increasing the total scanning time, or decreasing the total scanning time.

2. The SEM image acquisition method according to claim 1, further comprising:
   synthesizing a plurality of images of the position corresponding to the same region and the same pixels on the sample from when the sample is scanned from different rotation directions by the electron beam, on the basis of the signal detected and amplified.

* * * * *